(12) United States Patent
Nilsson

(10) Patent No.: US 6,700,447 B1
(45) Date of Patent: Mar. 2, 2004

(54) TRIMMING OF A TWO POINT PHASE MODULATOR

(75) Inventor: Magnus Nilsson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 10/236,648

(22) Filed: Sep. 6, 2002

(51) Int. Cl.[7] .................. H03L 7/06; H03L 7/085; H03L 7/099; H03L 7/18
(52) U.S. Cl. ................. 331/10; 331/1 A; 331/16; 331/17; 331/25; 331/177 V; 331/36 C; 332/127; 455/260
(58) Field of Search .............. 331/1 A, 8, 10, 331/11, 15–18, 25, 36 C, 117 R, 117 FE, 117 D, 177 V; 327/156–159; 332/127; 360/51; 375/376; 455/260

(56) References Cited

U.S. PATENT DOCUMENTS

| | | | |
|---|---|---|---|
| 4,743,867 A | * 5/1988 | Smith | 332/127 |
| 5,207,491 A | 5/1993 | Rottinghaus | 331/16 |
| 5,483,203 A | 1/1996 | Rottinghaus | 331/10 |
| 5,952,895 A | 9/1999 | McCune, Jr. et al. | 332/128 |
| 6,229,400 B1 | 5/2001 | McCollough et al. | 331/17 |
| 6,353,370 B1 | 3/2002 | Cox et al. | 331/117 R |

FOREIGN PATENT DOCUMENTS

| | | |
|---|---|---|
| DE | 2941049 | 4/1981 |
| DE | 3447118 | 7/1986 |
| EP | 0408238 | 7/1990 |
| EP | 0 961 412 A1 | 12/1999 |
| EP | 1 079 514 A1 | 2/2001 |
| EP | 1 223 670 A2 | 7/2002 |
| GB | 2 337 884 | 12/1999 |
| WO | WO 99/07066 | 2/1999 |
| WO | WO 99/43080 | 8/1999 |

* cited by examiner

*Primary Examiner*—David C. Mis
(74) *Attorney, Agent, or Firm*—Jenkens & Gilchrist, P.C.

(57) ABSTRACT

A frequency sythesizer and a method for synthesizing a signal having a given output frequency includes providing a controlled oscillator having a frequency control input and a feedback loop, applying a frequency control signal to the frequency control input, and compensating gain variation of the controlled oscillator outside of the feedback loop.

40 Claims, 4 Drawing Sheets

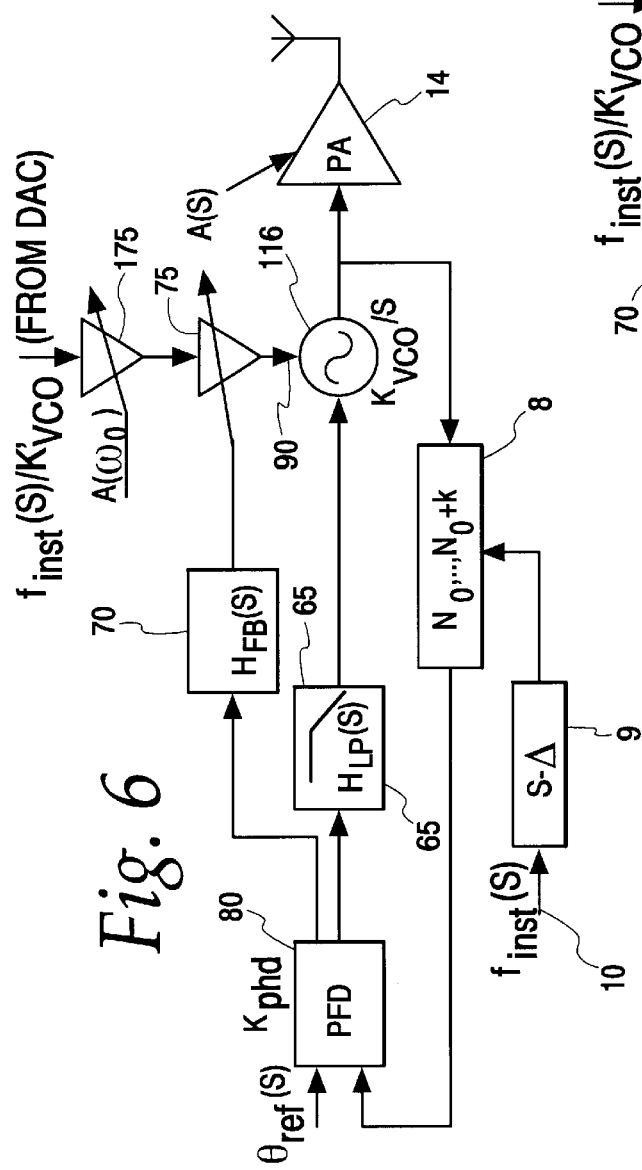

TRIMMING OF A TWO POINT PHASE MODULATOR

FIELD OF THE INVENTION

The invention relates to all areas where two-point phase modulation is used. In particular it relates to a Sigma Delta controlled fractional-N PLL modulator with an extra modulation input.

BACKGROUND OF THE INVENTION

A Sigma Delta controlled fractional-N PLL (phase-locked loop) is often used in a radio system for generating spurious-free local oscillator (LO)-frequencies and to allow faster frequency jumps. A block diagram of this is shown in FIG. 1 By controlling a frequency divider 8 ratio with a sigma-delta modulator 9, modulation with a constant envelope can be generated. By using these properties of the fractional N PLL 15, compact radio architectures for constant envelope systems e.g., Global Sysem for Mobile Communications (GSM) or DCS could be developed. This also means that a complete radio could be integrated into a single ASIC (application specific integrated circuit).

Since constant envelope systems aren't bandwidth efficient, some proposed systems also use amplitude modulation. Examples of these systems are EDGE (enhanced data GSM environment) and WCDMA (wideband code division multiple access).

If the modulating signal is divided into a phase part and an amplitude part, the phase part could be introduced in the fractional N PLL and the amplitude part could be added (effectively multiplied) in an amplifier after the PLL. In this way, switching blocks could be used throughout the complete modulator, which is very power efficient.

But when dividing the signal into amplitude and phase part, the bandwidth of the phase and amplitude part become much wider than the combined signal. Since the amplitude and phase part are combined in a multiplier after the PLL 15 this imposes stringent requirements on dynamic range and bandwidth of the amplitude and phase part and also on the timing between the amplitude and phase part.

For the phase part this means that the usable modulation bandwidth of the fractional N PLL is not wide enough. This bandwidth is limited by PLL noise, sigma-delta noise and matching issues.

One way to get around this limitation is to add a second modulation point, i.e., two-point modulation. By also inserting the modulation signal after the PLL loop filter, there is no trade-off between PLL loop bandwidth and modulation bandwidth.

Referring now to the drawings, in FIG. 1, the instantaneous frequency first is inserted at two points 10, 12 in the modulator and the amplitude part A(S) is inserted at the PA (power amplifier) 14.

The transfer function from the modulation inputs to the output of the VCO (voltage controlled oscillator) 16 can be derived as $$\theta_{out,VCO}(s) =$$

$$\frac{f_{inst}(s)}{Ns} \frac{K_{phd} \frac{K_{vco}}{s} H_{LP}(s)}{1 + K_{phd} \frac{K_{vco}}{s} H_{LP}(s)/N} + \frac{f_{inst}(s)}{K'_{vco}} \frac{\frac{K_{vco}}{s}}{1 + K_{phd} \frac{K_{vco}}{s} H_{LP}(s)/N} =$$

$$f_{inst} \frac{(s)}{s} \frac{\frac{K_{vco}}{K'_{vco}} + K_{phd} \frac{K_{vco}}{s} H_{LP}(s)/N}{1 + K_{phd} \frac{K_{vco}}{s} H_{LP}(s)/N} = [If, K_{vco} = K'_{vco}] = f_{inst} \frac{(s)}{s}$$

This is independent of PLL loop bandwidth.

This modulation scheme is included in patent document WO 99/07066, "Frequency synthesizer systems and methods for three point modulation with a DC-response."

However, a new unknown is introduced, namely, the estimation of the VCO gain. If the estimation of the VCO gain is wrong we get spectral growth and break the ACPR (adjacent channel power ratio) requirement of the system.

In a RF-ASIC with onboard VCO the VCO-gain is dependent on the size of the inductor, the output frequency and the bias point of the varactor. A standard VCO configuration is depicted in FIG. 2.

In FIG. 2, there are inductors L1, L2 (20, 22) and a parasitic capacitance (24) Cpar, a combination of all capacitor loading and all parasitics as seen from the resonator. Then there is the tuning network, consisting of Cc 26, 28 (coupling capacitors to couple the varactors loosely to the resonator), Cv 30, 32 (the actual varactors) and Rgnd 34, 36 (ground reference for the varactors). The bottom part shows the active components (e.g., transistors 35, 40) responsive for sustaining the oscillation.

The tuning sensitivity of the VCO is derived by taking the derivative of the output frequency with respect to the tuning voltage.

$$w_o = \frac{1}{\sqrt{L_{tot}C_{tot}}};$$

$$\frac{\partial w_o}{\partial V_{tune}} = \frac{\partial w_o}{\partial C_{tot}} \frac{\partial C_{tot}}{\partial C_V} \frac{\partial C_V}{\partial V_{tune}} =$$

$$-\frac{L_{tot}}{2(L_{tot}C_{tot})^{3/2}} \frac{1}{2}\left(\frac{C_c}{C_c + C_V}\right)^2 \frac{\partial C_V}{\partial V_{tune}} = -\frac{L_{tot}w_o^3}{2} \frac{1}{2}\left(\frac{C_c}{C_c + C_V}\right)^2 \frac{\partial C_V}{\partial V_{tune}}$$

The tuning sensitivity is dependent on many parameters.

The VCO on-chip inductor (e.g., L1, L2) is a large metal structure and is inherently stable.

The varactor capacitance and the slope of the varactor capacitance are dependent on the tuning voltage. The tuning voltage is dependent on the VCO center frequency.

By making a careful design keeping the above equation in mind, the total VCO gain variation could be reduced, but usually other parameters limit the flexibility.

A table with measured VCO gain versus frequency could compensate the variation. However, the main problem with this solution is that when manufacturing these circuits, the parasitic capacitance (Cpar) of the resonator varies and a different tuning voltage is required to get the correct output frequency. The VCO gain could vary as much as 50% from one sample to the other. This means that the VCO gain would have to be measured for each VCO chip to get stable performance.

In WO 99/07066 the author describes a different circuit configuration, where the VCO has two separate inputs, one for the PLL tuning voltage and one for the modulation input. A circuit configuration for this is depicted in FIG. 3.

In FIG. 3, a separate tuning input V mod 50 is added for modulation. This input is similar to the original tune input V tune 42 but it has a DC-voltage applied to set the operating point of the varactor.

Using this modified VCO (FIG. 3) means that the varactors can be biased at a suitable DC-level. Also the input bandwidth and tuning sensitivity can be optimized for modulation. If the DC-level applied to the varactors is constant, the only thing varying in the previous formula is the center frequency. This solution is independent of parasitic capacitor variations, since this is compensated in the tuning voltage.

This means that the VCO-gain variation from sample to sample is mainly dependent on spread in the varactor at the specific bias point and spread in the coupling capacitor. By careful design this could be less than 10% (mainly by choosing large size components).

However, for future systems with more complex modulation schemes (for example 16 QAM) the requirement of VCO-gain estimations will be higher using this modulation scheme. Therefore, some kind of automatic calibration is necessary. Also, using automatic calibration would secure a higher yield and more stable operation.

SUMMARY OF THE INVENTION

The present invention overcomes the above limitations by means of a frequency synthesizer generating an output frequency. The frequency synthesizer comprises a controlled oscillator having a tuning input which is responsive to a frequency control input signal to generate an output frequency, and having a feed back loop. The frequency synthesizer further comprises a compensation circuit for compensating gain variation of the controlled oscillator outside of the feedback loop.

The feed back loop further comprises a phase comparator wherein the phase comparator is responsive to a reference frequency signal and a feedback signal for producing an error output signal. The phase comparator comprises a first charge pump and a second charge pump. The first charge pump receives the reference frequency signal and the second charge pump receives a divided signal. The first and second charge pumps produce first and second output currents, wherein the first output current is used as an error signal and the second output current is used for trimming a gain estimation of the controlled oscillator.

BRIEF DESCRIPTION OF THE DRAWINGS

In the drawings:

FIG. 5 is a block diagram of a modulator using two-point phase modulation and feedback for setting the VCO gain estimation;

FIG. 6 is a block diagram of another embodiment of a modulator using two-point phase modulation and feedback for setting the VCO gain estimation.

DETAILED DESCRIPTION OF THE ILLUSTRATED EMBODIMENTS

Figure 3:
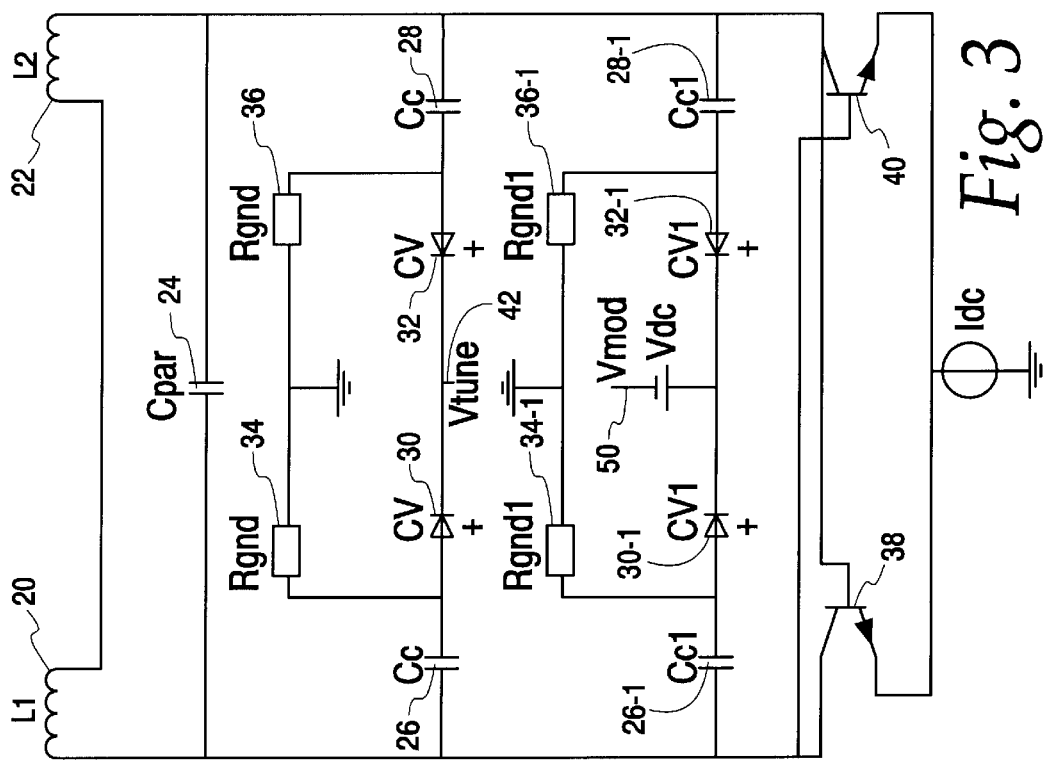
FIG. 3 is a simplified schematic of a modified VCO optimized for modulation.
Figure 2:
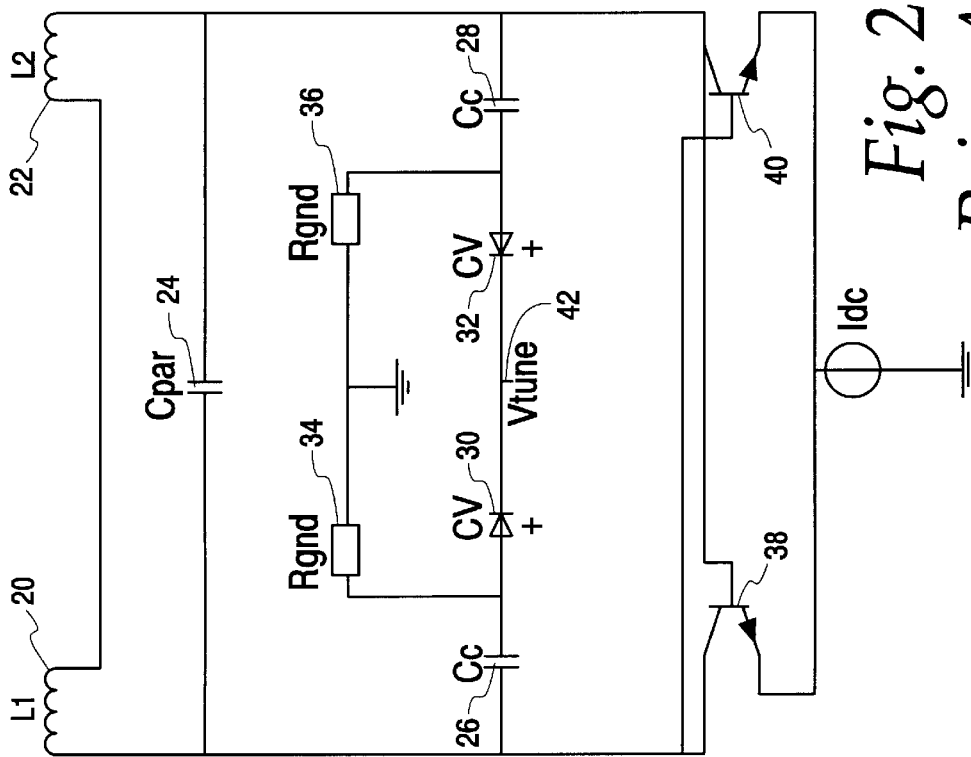
FIG. 2 is a simplified schematic of a typical differential, on-chip VCO.

If the modified VCO (FIG. 3) is used, an estimation of the VCO-gain variation could be added by changing the DC-level at the modulation input varactor. By applying the estimation after the DAC (that is, the DAC used for applying modulation at the VCO input), the dynamic range requirement of this DAC is unaffected. These general considerations apply for the below-described feedback systems as well.

Figure 1:
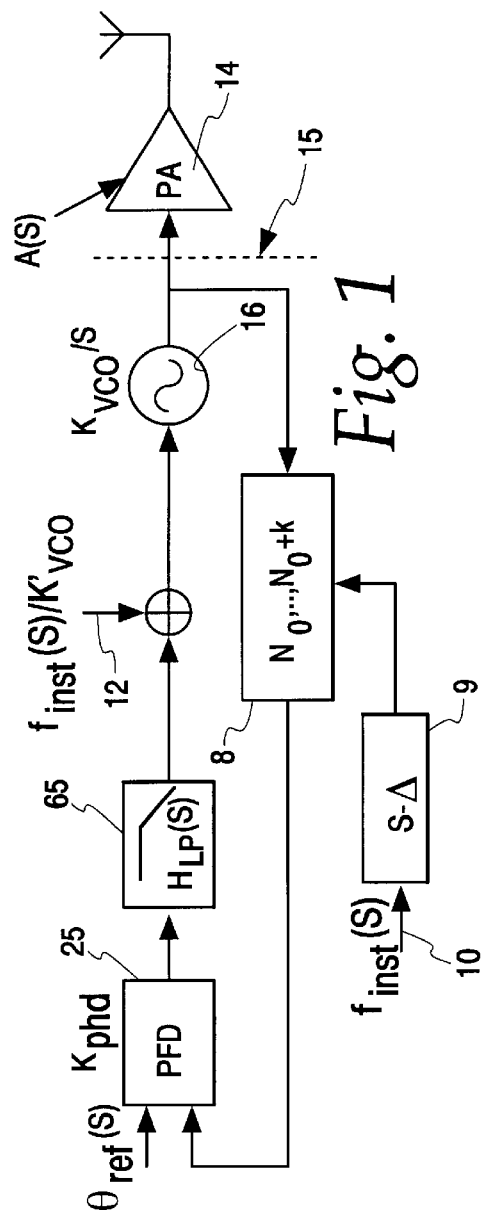
FIG. 1 is a block diagram showing two-point modulation.

The modulation signal applied at the VCO input is suppressed by the PLL. Therefore, a counteracting output is produced from the phase detector 25. Now if the same modulation signal is applied at the prescaler input, the phase detector output is zero. By using the block diagram of FIG. 1, the transfer function to the chargepump (PFD) 25 output is derived.

$$\theta_{out\_PFD}(s) = f_{inst}(s) \frac{K'_{vco} - K_{vco}}{K'_{vco}} \frac{\frac{K_{phd}}{Ns}}{1 + \frac{K_{phd} K_{vco} H_{LP}(s)}{Ns}}$$

This signal can be used to trim the VCO gain estimation.

Figure 4:
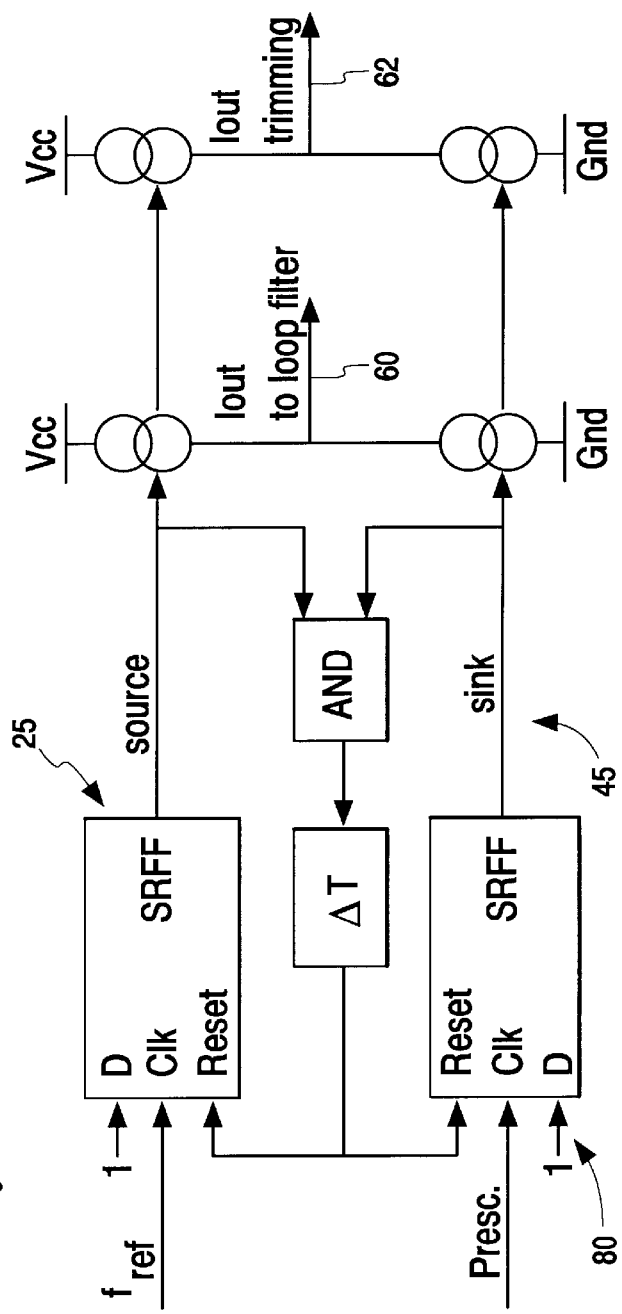
FIG. 4 is a block diagram showing a modified phase detector with an extra charge pump.

The phase detector signals could be measured by adding an extra charge pump working in parallel with the original one. FIG. 4 shows a phase detector with two charge pumps 25, 45. The second charge pump 45 is used for the feedback path. The output from this extra charge pump is measured in a matched filter 70 (see FIG. 5), which also sets the dynamics of the regulation. The filter must be able to detect the polarity of the error signal to produce the correction signal. The polarity can be measured by correlating the output signal with the original modulation signal.

In FIG. 4, two output currents 60, 62 are produced with the same duty cycle. One output 60 is used for the ordinary PLL loop filter and the other 62 is used for trimming the VCO gain estimation.

A block diagram of the proposed trimming method is shown in FIG. 5. This scheme uses the phase detector 80 of FIG. 4 to measure the phase difference in the phase detector. In FIG. 5, the filter 65 in the feedback path is used both for measuring the modulation error due to VCO-gain estimation error and setting the dynamic behavior of the trimming loop. Since part of the VCO gain variation is known this could be compensated outside the feedback loop. This enables a faster control since the range of a variable amplifier 75 in the control loop could be reduced.

FIG. 6 shows a block diagram in which compensation for VCO-gain variation due to center frequency variations is added.

This version (FIG. 6) includes a rough estimation due to the center frequency (from the DAC) at the input of an amplifier 175, which reduces the gain range of the feedback path. This figure also shows a VCO version 116 with separate modulation input 90. Using this VCO 116 the amplifiers 75, 175 could change the DC level applied to the varactor (as in FIG. 3). The center frequency is set by adding a DC-voltage to the S-Δ input 0, corresponding to the average division ration (fout/fref).

A test signal could be applied to the two modulation points. If the VCO gain estimation is correct there will be no output from the phase detector 80. If the integrated PLL output signal is sampled coherent at the test signal frequency we get a DC voltage corresponding to the mismatch. This voltage can be used to set the gain in the second modulation path 175, 75 and we have a feedback system for controlling the VCO gain estimation. Some additional filtering 70 could be applied to get the correct dynamics in the compensation loop.

The test signal is seen at the PLL output. Therefore, the test signal has to be chosen low enough not to destroy the ACPR spectra, if the test signal is applied outside the transmit channel, or the EVM (error vector magnitude), if the signal is applied inside the transmit channel. The test signal is mixed with the amplitude signal after the PLL (see FIG. 1) so it will not appear as a spur at the modulator output.

When using the dual chargepump solution, the error signal measured represents a HP-filtered version of the phase error signal. Since the main energy of the error signal is contained in the LF part this could mean the quality of the error signal is less than optimal.

If the error signal is measured after the loop filter instead, we have a LP-filtered version of the frequency error, which could be used for automatic tuning. The error signal then becomes:

$$f_{error}(s) = f_{inst}(s) \frac{K'_{vco} - K_{vco}}{K'_{vco}} \frac{\frac{K_{phd}H_{LP}(s)}{Ns}}{1 + \frac{K_{phd}K_{vco}H_{LP}(s)}{Ns}}$$

Figure 7:
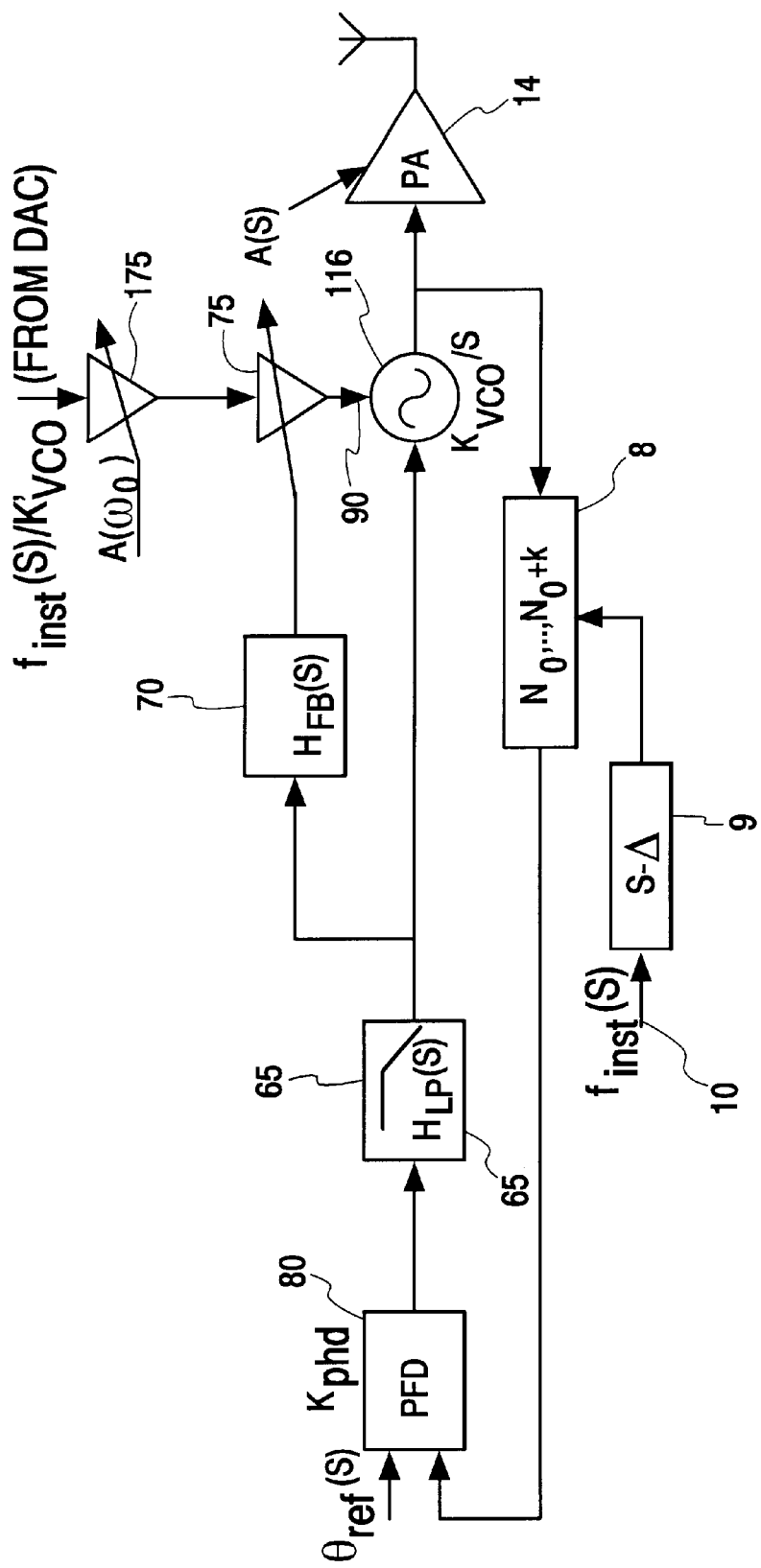
FIG. 7 is a block diagram of a modulator similar to FIG. 6, modified to measure the loop voltage instead of the chargepump output.

This requires that both frequency insertion points are DC-coupled. A block diagram of this solution is presented in FIG. 7.

All these trimming methods are described above with reference to the two modulation points at the VCO and prescaler input. However, they could equally be applied to any two-point modulator which has one LP-path and one HP-path. For instance the LP path could be supplied through the PLL reference.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A frequency synthesizer which generates an output frequency, comprising:
   a controlled oscillator having a tuning input which is responsive to a frequency control input signal to generate an output frequency, and having a feedback loop; and
   a compensation circuit for compensating gain variation of said controlled oscillator outside of said feedback loop.

2. The frequency synthesizer of claim 1 wherein said feedback loop comprises a programmable frequency divider which is responsive to the output frequency and to a divider control input, to divide the output frequency in response to the divider control input, to thereby produce a divided signal.

3. The frequency synthesizer of claim 2 wherein said feedback loop further includes a phase comparator which is responsive to a reference frequency signal and to the divided signal to compare the reference frequency signal and the divided signal and thereby produce an error signal.

4. The frequency synthesizer of claim 2 and further including a sigma-delta modulator which is responsive to an instantaneous output frequency to produce the divider control input.

5. The frequency synthesizer of claim 3 wherein said feedback loop further includes a loop filter which is responsive to the error signal to produce the frequency control input signal.

6. The frequency synthesizer of claim 1 wherein said compensation circuit applies an estimate of said gain variation to said controlled oscillator.

7. The frequency synthesizer of claim 1 further including a digital-to-analog converter for applying modulation to said controlled oscillator and wherein said compensation circuit is coupled to said controlled oscillator for applying an estimation of said gain variation after said digital-to-analog converter.

8. The frequency synthesizer of claim 3 wherein said phase comparator is responsive to a reference frequency signal and a feedback signal for producing an error output signal; and wherein said phase comparator comprises a first charge pump and a second charge pump, said first charge pump receiving said reference frequency signal and said second charge pump receiving said divided signal, said first and second charge pumps producing first and second output currents, said first output current being usable as an error signal and said second output current being usable for trimming a gain estimation of said controlled oscillator gain.

9. The frequency synthesizer of claim 8 and further including a loop filter which is responsive to said error signal for producing the frequency control input signal, and a trimming circuit responsive to said second output current for setting the dynamic behavior of a trimming loop comprising said compensation circuit.

10. The frequency synthesizer of claim 9, said compensation circuit further including a variable amplifier coupled with said controlled oscillator for introducing an estimation of said gain variation based upon a center frequency of a desired output frequency so as to reduce the gain range of the feedback loop.

11. The frequency synthesizer of claim 10 wherein said controlled oscillator has a separate modulation input for receiving an output of said variable amplifier.

12. The frequency synthesizer of claim 5 wherein said compensation circuit is located after said loop filter.

13. A method of synthesizing a signal having a given output frequency, said method comprising:
   generating an output frequency in response to a frequency control signal applied to a frequency control input of a controlled oscillator having a feedback loop; and
   compensating gain variation of the controlled oscillator outside of the feedback loop.

14. The method of claim 13, including, in said feedback loop, dividing the output frequency in response to a divider control input of a programmable divider, to thereby produce a divided signal.

15. The method of claim 14 and further including comparing the reference frequency signal and the divided signal at a phase comparator and producing a first error signal.

16. The method of claim 14 further including using a sigma-delta modulator which is responsive to an instantaneous output frequency to produce the divider control input.

17. The method of claim 13 wherein said generating comprises applying a reference frequency signal and a feedback signal to a phase comparator for producing an error output signal; and wherein said phase comparator comprises a first charge pump and a second charge pump, said reference frequency signal being applied to said first charge pump and a prescaler input signal comprising said feedback signal being applied to said second charge pump, said first and second charge pumps producing a first and a second output current, said first output current being usable as an error signal and said second output current being usable for trimming a gain estimation of said controlled oscillator gain.

18. The method of claim 17 and further including producing the frequency control input signal in response to said error signal, and setting the dynamic behavior of a trimming loop in response to said second output current.

19. The method of claim 18 and further including introducing an oscillator gain estimation based upon a center frequency of a desired output frequency so as to reduce a gain range of the feedback loop.

20. A phase detector comprising:
a phase comparator which is responsive to a reference frequency signal and a feedback signal for producing an error output signal; said phase comparator comprising a first charge pump and a second charge pump, said first charge pump receiving a reference frequency signal and said second charge pump receiving a prescaler input signal, said first and second charge pumps producing first and second output currents, said first output current being usable as an error signal and said second output current being usable for trimming a gain estimation of a controlled oscillator gain.

21. A system for synthesizing a signal having a given output frequency, said system comprising:
means for producing an output frequency in response to a frequency control signal applied to a frequency control input of a controlled oscillator having a feedback loop; and
means for compensating gain variation of the controlled outside of the feedback loop.

22. The system of claim 21, including, in said feedback loop, means for dividing the output frequency in response to a divider control input of a programmable divider, to thereby produce a divided signal.

23. The system of claim 22 and further including means for comparing the reference frequency signal and the divided signal and producing a first error signal.

24. The system of claim 22 further including a sigma-delta modulator which is responsive to an instantaneous output frequency to produce the divider control input.

25. The system of claim 21 wherein said means for said producing comprises means for applying a reference frequency signal and a feedback signal to a phase comparator for producing an error output signal; and wherein said phase comparator comprises a first charge pump and a second charge pump, said reference frequency signal being applied to said first charge pump and a prescaler input signal comprising said feedback signal being applied to said second charge pump;
said first and second charge pumps producing a first and second output current, said first output currents being usable as an error signal and said second output current being usable for trimming a gain estimation of said controlled oscillator gain.

26. The system of claim 25 and further including means for producing the frequency control input signal in response to said error signal and for setting the dynamic behavior of a trimming loop in response to said second output current.

27. The system of claim 26 and further including means for introducing an oscillator gain estimation based upon a center frequency of a desired output frequency so as to reduce a gain range of the feedback loop.

28. A phase detector comprising:
phase comparator means for producing an error output signal in response to a reference frequency signal and a feedback signal; said phase comparator means comprising first charge pump means for receiving a reference frequency signal and producing a first output current and second charge pump means for receiving a prescaler input signal and producing a second output current; said first output current being usable as an error signal and said second output current being usable for trimming a gain estimation of a controlled oscillator gain.

29. A two-point phase modulator which has a compensation loop for automatic VCO gain compensation, comprising:
a controlled oscillator having a tuning input which is responsive to a frequency control input signal to generate an output frequency, and having a feedback loop; and
a compensation circuit for compensating gain variation of said controlled oscillator outside of said feedback loop.

30. The modulator of claim 29 wherein said feedback loop comprises a programmable frequency divider which is responsive to the output frequency and to a divider control input, to divide the output frequency in response to the divider control input, to thereby produce a divided signal.

31. The modulator of claim 30 wherein said feedback loop further includes a phase comparator which is responsive to a reference frequency signal and to the divided signal to compare the reference frequency signal and the divided signal and thereby produce an error signal.

32. The modulator of claim 31 and further including a sigma-delta modulator which is responsive to an instantaneous output frequency to produce the divider control input.

33. The modulator of claim 31 wherein said feedback loop further includes a loop filter which is responsive to the error signal to produce the frequency control input signal.

34. The modulator of claim 29 wherein said compensation circuit applies an estimate of said gain variation to said controlled oscillator.

35. The modulator of claim 29 further including a digital-to-analog converter for applying modulation to said controlled oscillator and wherein said compensation circuit is coupled to said controlled oscillator for applying an estimation of said gain variation after said digital-to-analog converter.

36. The modulator of claim 31 wherein said phase comparator is responsive to a reference frequency signal and a feedback signal for producing an error output signal; and wherein said phase comparator comprises a first charge pump and a second charge pump, said first charge pump receiving said reference frequency signal and said second charge pump receiving said divided signal, said first and second charge pumps producing first and second output currents, said first output current being usable as an error signal and said second output current being usable for trimming a gain estimation of said controlled oscillator gain.

37. The modulator of claim 36 and further including a loop filter which is responsive to said error signal for producing the frequency control input signal, and a trimming circuit responsive to said second output current for setting the dynamic behavior of a trimming loop comprising said compensation circuit.

38. The modulator of claim 37, said compensation circuit further including a variable amplifier coupled with said controlled oscillator for introducing an estimation of said gain variation based upon a center frequency of a desired output frequency so as to reduce the gain range of the feedback loop.

39. The modulator of claim 38 wherein said controlled oscillator has a separate modulation input for receiving an output of said variable amplifier.

40. The modulator of claim 33 wherein said compensation circuit is located after said loop filter.

* * * * *